(12) United States Patent
Numano

(10) Patent No.: US 7,075,956 B2
(45) Date of Patent: Jul. 11, 2006

(54) OPTICAL SEMICONDUCTOR DEVICE

(75) Inventor: Masaru Numano, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 10/648,214

(22) Filed: Aug. 27, 2003

(65) Prior Publication Data
US 2004/0151219 A1    Aug. 5, 2004

(30) Foreign Application Priority Data
Jan. 31, 2003    (JP) ............................. 2003-023124

(51) Int. Cl.
*H01S 3/13*    (2006.01)

(52) U.S. Cl. ............................. 372/29.015; 372/29.01; 372/29.014

(58) Field of Classification Search ............ 372/29.015
See application file for complete search history.

(56) References Cited

U.S. PATENT DOCUMENTS

| | | | |
|---|---|---|---|
| 4,658,203 A | | 4/1987 | Freymuth |
| 4,745,610 A | * | 5/1988 | Yoshikawa ............... 372/38.02 |
| 4,975,798 A | * | 12/1990 | Edwards et al. .............. 361/56 |
| 5,521,414 A | * | 5/1996 | Palara ........................ 257/355 |
| 6,078,204 A | * | 6/2000 | Cooper et al. .............. 327/309 |
| 6,617,906 B1 | * | 9/2003 | Hastings ..................... 327/321 |

FOREIGN PATENT DOCUMENTS

| | | |
|---|---|---|
| JP | 6-216321 | 8/1994 |
| JP | 10-136564 | 5/1998 |

* cited by examiner

*Primary Examiner*—James Vannucci
(74) *Attorney, Agent, or Firm*—Oblon, Spivak, McClelland, Maier & Neustadt, P.C.

(57) ABSTRACT

An optical semiconductor device comprises: an optical semiconductor element; and a circuit. The circuit is connected to the optical semiconductor element and has a series rectifying circuit including a plurality of zener diodes connected in series. The circuit further has a rectifying element whose anode is connected to an anode of the series rectifying circuit.

18 Claims, 16 Drawing Sheets

OPTICAL SEMICONDUCTOR DEVICE

CROSS-REFERENCE TO RELATED APPLICATIONS

This application is based upon and claims the benefit of priority from the prior Japanese Patent Application No. 2003-023124, filed on Jan. 31, 2003; the entire contents of which are incorporated herein by reference.

BACKGROUND OF THE INVENTION

1. Field of the Invention

The present invention relates to optical semiconductor device, and more particularly, to optical semiconductor device having a optical semiconductor element and a circuit connected thereto and used under the environment where light is irradiated.

2. Discussion of the Background

Optical semiconductor devices, such as an optical sensor, photo-coupler, photo-interrupter, or a device for an optical link system include an optical semiconductor element such as a photo-detecting element and a light emitting element. In many cases, a circuit connected to the optical semiconductor element is also provided in such an optical semiconductor device.

The circuit supplies a voltage or a current for driving the optical semiconductor device. Moreover, the circuit may also have a role to process the signal which is emitted from the optical semiconductor device or accepted on the optical semiconductor device.

In some cases, the circuit may include a circuit where two or more rectifiers are connected in series.

FIG. 16 is a schematic diagram illustrating such a circuit. This figure shows a circuit in which the n zener diodes 1 are connected in series. The zener diode 1 is an active element where the breakdown phenomenon of a p-n junction is utilized.

The breakdown voltage Vz of the zener diode is usually around 5 volts when it is made of silicon (Si). Then, the series connection circuit of the zener diodes 1 shown in FIG. 16 can be used as a protection circuit for protecting optical semiconductor devices including a photo-detecting device and a light emitting element from destruction by ESD (Electro-Static Discharge).

Moreover, the series connection circuit of zener diodes 1 can be also used as a standard power supply of a series regulator in a power supply for driving an optical semiconductor element, and as a clamp circuit for protecting a gate of a MOS transistor.

Since the breakdown voltage of Vz of each zener diode 1 is about 5 volts, high voltages, such as 30 volts and 40 volts, can be obtained easily. Such a series circuit can also clamp a voltage. Therefore, when the chip size of IC is restricted, it is convenient to use the zener diodes 1. For example, when clamping 30 volts, six zener diodes 1 may be employed and connected in series.

In the case of the circuit illustrated in FIG. 16, n zener diodes 1 are connected in series, and a power supply E1 is connected between the both ends, that is, between the terminal PK and the terminal PA. This power supply is virtual, and for deciding the potentials of the terminals of the series circuit of n zener diodes 1, and may not necessarily be an external power supply.

A zener diode 1 is made on p type silicon substrate grounded through the terminal PS, as mentioned after. Further, a power supply E2 is connected between the terminal PA and the terminal PS. Therefore, the potential of the terminal PK becomes the highest in this circuit.

In this circuit, the relation with power supplies E1 and E2 is always represented by the following formula:

$$E1 \geq E2$$

Even if a power supply E1 changes, unless power supplies E1 and E2 have the above (n×Vz) potential difference, current does not flow through the zener diodes 1.

If the potential difference beyond it arises between the power supplies E1 and E2, current will flow through the zener diodes 1 and the voltage between the terminal PK and the terminal PA will be clamped at (n×Vz) volts.

FIG. 17 is a schematic diagram illustrating the example of a series clamp circuit in which n zener diodes 1 are used. Here, the ESD (Electro-Static Discharge) clamp circuit 6 is inserted between the IC output terminal Vo and the constant voltage terminal Vdd.

This clamp circuit operates at the voltage more than Vdd. To meet this need, the n zener diodes 1 are connected in series. And if the potential difference between the Vdd terminal and the Vo terminal becomes above (n×Vz), the clamp circuit begins to operate. In the case of this circuit, the Vdd terminal corresponds to the terminal PK in FIG. 16, and the base of the NPN-transistor 20 corresponds to the terminal PA in FIG. 16.

A surge absorption circuit with zener diodes provided in a regeneration control system for inductive load is disclosed in Japanese Patent Laid-Open Disclosure No. 10-136564. The diode for preventing an adverse current is connected in series to the zener diode as a surge absorption element in this surge absorption circuit.

However, it is thought that this diode for preventing the adverse current is for preventing that a current flows from a power supply to FET in the state of ON of FET.

Another circuit for controlling a regeneration voltage is disclosed in the U.S. Pat. No. 4,658,203. In this circuit, a feedback circuit having a zener diode and an opposite direction diode is inserted between a drain and a gate of a switching element which controls a motor as a load. The opposite direction diode has a role to prevent the feedback circuit from turning on at the time of the normal operation of the switching element.

SUMMARY OF THE INVENTION

According to an embodiment of the invention, there is provided an optical semiconductor device comprising: an optical semiconductor element; and a circuit connected to the optical semiconductor element, having a series rectifying circuit including a plurality of zener diodes connected in series, and having a rectifying element whose anode is connected to an anode of the series rectifying circuit.

According to other embodiment of the invention, there is provided an optical semiconductor device comprising: an optical semiconductor element; and a circuit connected to the optical semiconductor element, having a series rectifying circuit including a plurality of first rectifying elements connected in series, and having a second rectifying element whose anode is connected to an anode of the series rectifying circuit.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

As a result of original examination, the Inventor has found that the above-mentioned problems are caused by a light being irradiated to the parasitic diode which accompanies the zener diode 1. The mechanism of this problem will now be described in detail.

Figure 18A:
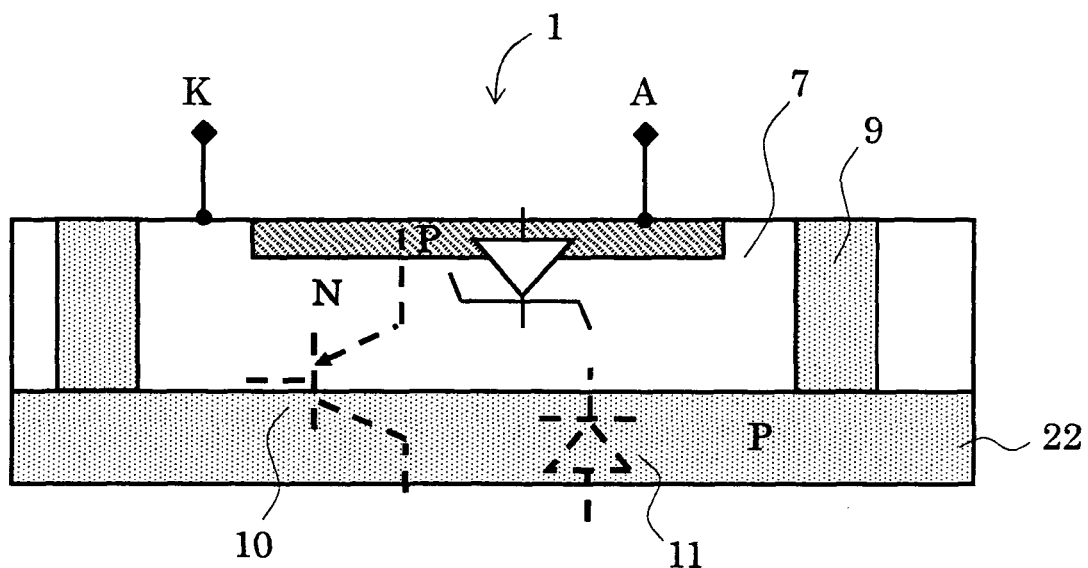
FIG. 18A is a schematic diagram illustrating the cross-sectional structure of the zener diode 1.
Figure 18B:
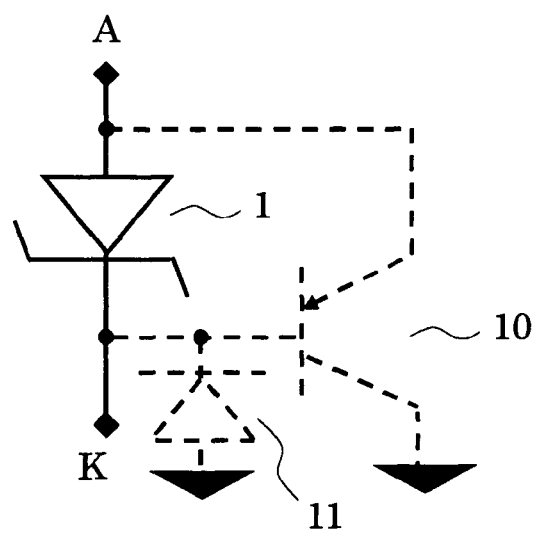
FIG. 18B is a diagram showing the equivalent circuit thereof.

FIG. 18A is a schematic diagram illustrating the cross-sectional structure of the zener diode 1, and FIG. 18B is a diagram showing the equivalent circuit thereof. The n type islands 7 separated by p type separation layer 9 is formed on p type silicon substrate 22. The zener diode 1 is formed by forming the p type diffusion layer 8 in the surface of the n type island 7 in a planar fashion. The n type island 7 serves as the cathode K, and p type diffusion layer 8 serves as the anode A.

In the case of such structure, the parasitic p-n-p junction 10 is formed in a vertical direction by the p type diffusion layer 8, the n type island 7, and the p type separation layer 9. Moreover, the parasitic photo-diode (PD) 11 is formed by the n type island 7 and the p type separation layer 9. Since the p type substrate 22 is connected to a ground potential (GND), the collector of the vertical parasitic PNP transistor 10 and the anode of the parasitic PD 11 are grounded. The virtual terminal PS 7 is connected hereto.

Figure 16:
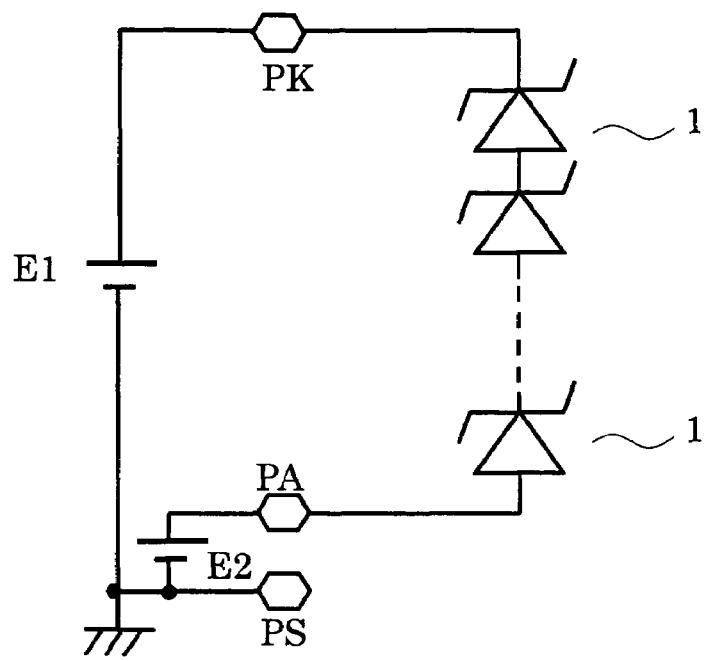
FIG. 16 is a schematic diagram illustrating a circuit.
Figure 17:
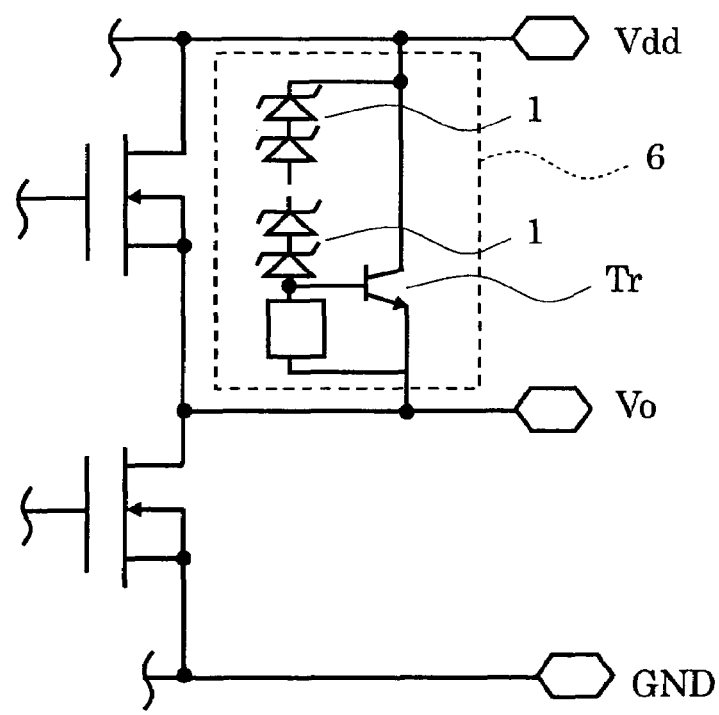
FIG. 17 is a schematic diagram illustrating the example of a series clamp circuit in which n zener diodes 1 are used.
Figure 19:
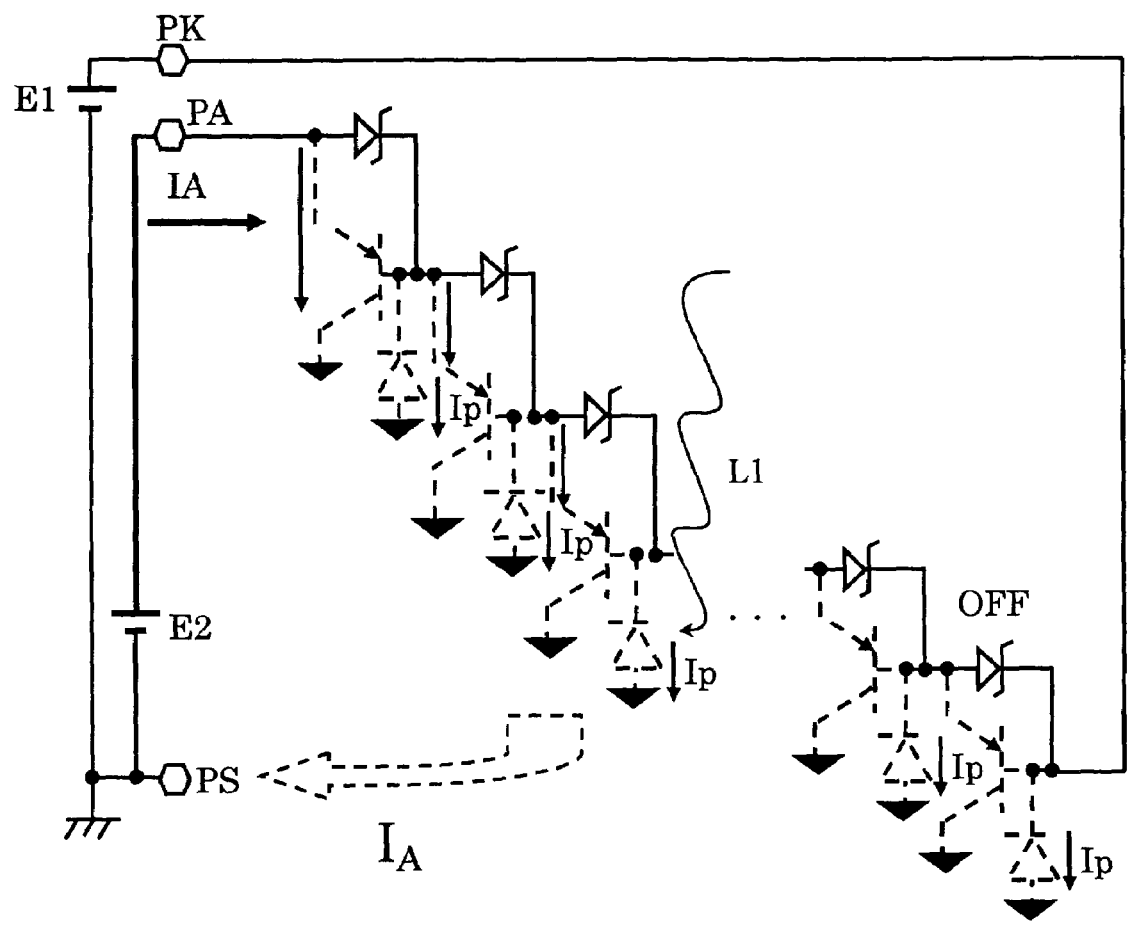
FIG. 19 is a schematic diagram where the parasitic elements are added to the circuit shown in FIG. 16.

FIG. 19 is a schematic diagram where the parasitic elements are added to the circuit shown in FIG. 16. Such a circuit for optical semiconductors is located near a photo-detecting device or a light emitting element in many cases. Therefore, the circuit is prone to be exposed to a light of high intensity. And when the zener diodes 1 are not in a state of breakdown operation, a leak current which flows to the silicon substrate 22 by light L1 occurs due to the existence of the parasitic PNP transistor 10 and the parasitic diode 11. The mechanism will be explained in the following:

First, a leak current is generated when the potential difference of the terminal PA and the terminal PK are zero or small. That is, the leak current becomes remarkable when there is almost no difference between E1 and E2. The parasitic PNP transistors 10 are connected to form a Darlington circuit. When light L1 incidences, currents Ip are drawn out through the parasitic PD 11 from the bases of the parasitic PNP transistors 10.

Since the parasitic PNP transistors 10 are connected to form the Darlington circuit, currents Ip are amplified by hFE times, respectively. Therefore, currents Ip are cumulatively amplified by each parasitic PNP transistor 10. The total current IA flows from the power supply E2 to the p type substrate 22 through the terminal PA, and reaches terminal PS.

Moreover, since E1>E2, the parasitic PNP transistors on the far-right portion in FIG. 19 will be in a reverse bias state, that is an OFF state. Therefore, the influence of the power supply E1 is intercepted from the Darlington circuit including these parasitic PNP transistors.

Thus, since the (n−1) parasitic PNP transistors 10 operate, the current IA which flows into the p type substrate 22 from the terminal PA is expressed by the following formula:

$$IA = \left(\sum_{k=1}^{n-1} hFE^k\right) Ip$$

This current IA flows from the power supply E2 to each parasitic PNP transistor 10 through the terminal PA, passes through the p type substrate 22, and reaches the terminal PS. On the other hand, there is no current which flows into the terminal PK.

When the potential of the terminal PA is lower enough than the potential of the terminal PK, all zener diodes 1 become in a state of ON, and the leak current is not generated.

As explained above, if light L1 is irradiated at the parasitic PDs 11 which accompanies the zener diodes, current will arise. This current is amplified by the parasitic transistors 10 and becomes a large leak current. Since there is such a leak current, the total current consumption of the whole IC will increase. Moreover, the degradation of the operation characteristic and malfunction may arise. Moreover, the degree of these problems is influenced by the amount of the irradiated light.

Therefore, when using such a circuit as a circuit for optical semiconductors which outputs or inputs light, the problem that it is hard to use it arises since the stability of a circuit is influenced by the amount of light.

Such a problem is a specific one which becomes remarkable, when using the circuit where two or more rectifiers, such as zener diodes, are connected in series under the environment where a light is irradiated. That is, since two or more rectifiers are connected in series, a Darlington circuit of the parasitic transistors which accompany the rectifiers are made, and a leak current by a light is amplified cumulatively. As a result, a large leak current will flow.

The Inventor has experimentally covered the zener diode 1 with an aluminum layer whose thickness is about 1 micrometer so that a light might not be irradiated thereto directly. However, although leak current decreased, it was difficult to be completely eliminated. This may have been caused by the light penetrating the covering aluminum layer, or by that a leak current has occurred by a light intruding from around the circumference.

Since circuits for optical semiconductors shown in FIG. 16 through FIG. 19 are used near the light source and under the environment of high optical intensity, it is considered that it is difficult to eliminate the leak current completely by providing a shading layer.

Based on the knowledge explained in full detail above, the Inventor has come to make the invention. Hereafter, some embodiment of the invention will be explained referring to the drawings.

Figure 1:
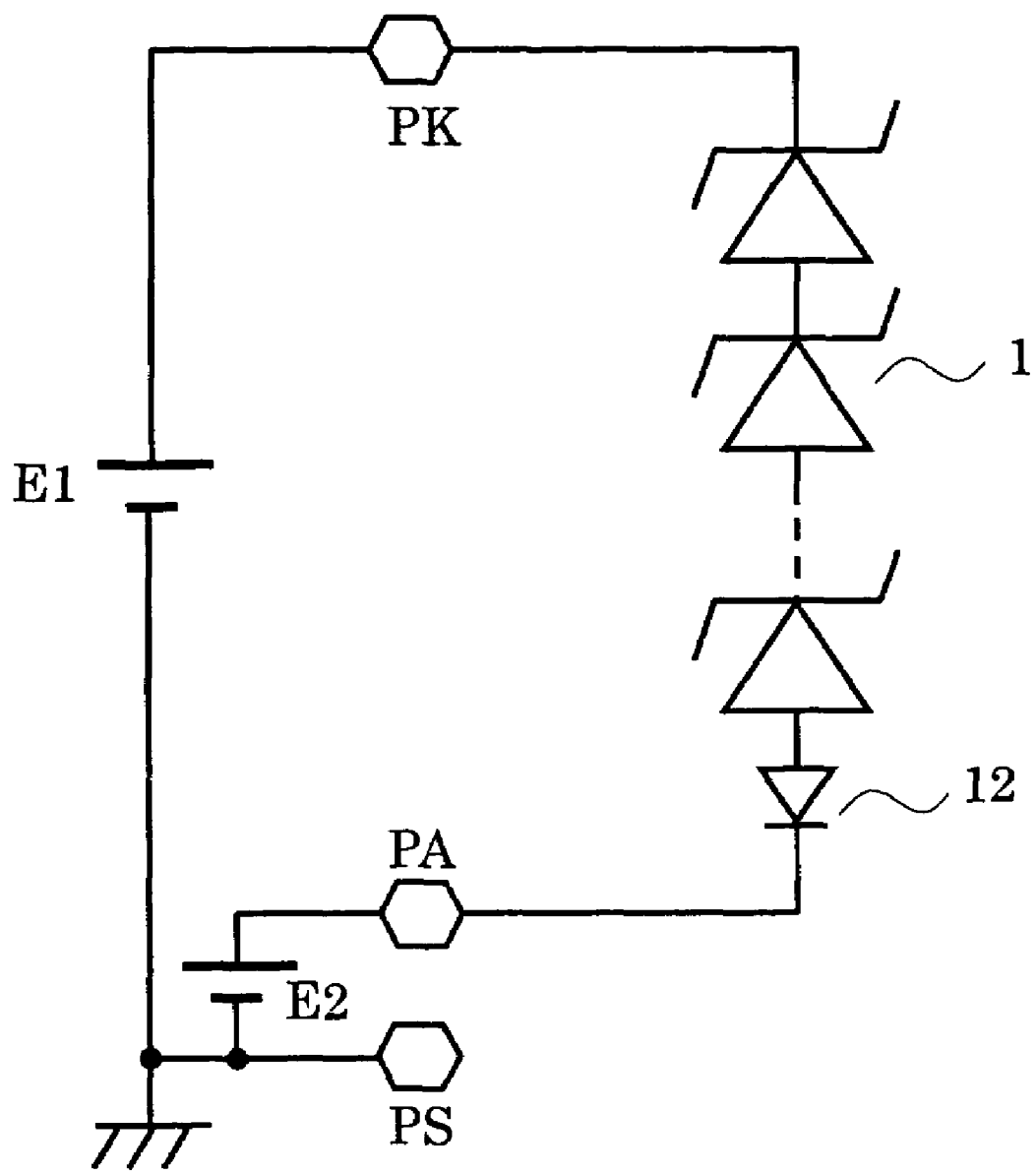
FIG. 1 is a schematic diagram showing the principal part of a circuit for optical semiconductors to be provided in an optical semiconductor device according to the embodiment of the invention.

FIG. 1 is a schematic diagram showing the principal part of a circuit for optical semiconductors to be provided in an optical semiconductor device according to the embodiment of the invention. This circuit has two or more zener diodes 1 connected in series like what was explained with reference to FIG. 16.

Figure 2:
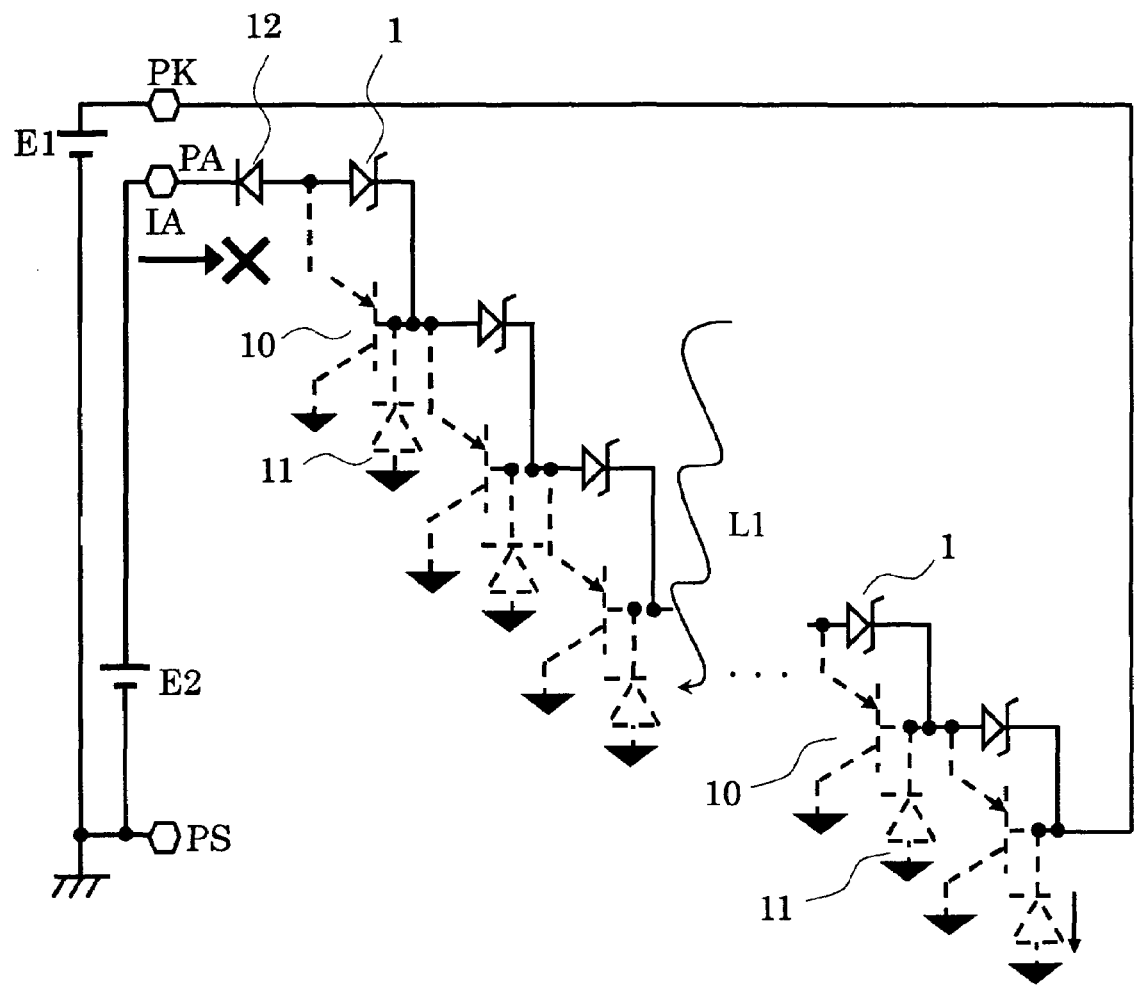
FIG. 2 is a schematic diagram where the parasitic transistors and parasitic diodes which accompany the zener diodes 1 in the circuit shown in FIG. 1 are also shown.

FIG. 2 is a schematic diagram where the parasitic transistors and parasitic diodes which accompany the zener diodes 1 in the circuit shown in FIG. 1 are also shown.

As expressed in these figures, a diode 12 is inserted in the anode terminal side of the series circuit of the zener diodes 1. That is, the diode 12 is inserted in the upstream side of the zener diodes 1 as seen in the course of the leak current which flows into a zener diode 1 from a power supply E2.

Moreover, the cathode 30 is inserted in the diode 12 towards the PA terminal side. A diode 12 is in a forward direction to the direction of the current which flows when a zener diode 1 carries out a break down and will be in an ON state.

Even if light L1 is irradiated by the series circuit of a zener diode, the leak current which flows into an anode terminal can be intercepted by forming such a diode 12. In this case, since the diode 12 is formed in the upstream side of the zener diodes 1, the leak current which flows into the zener diodes 1 can certainly be intercepted.

It is desirable that the breakdown voltage of the diode 12 is more than the voltage of the power supply E2 in the embodiment. If the breakdown voltage of the diode 12 is equal to a voltage E3 which is lower than the voltage of the power supply E2, a voltage (E2−E3) will be applied to the series circuit of n zener diodes. As a result, number of the parasitic PNP transistors of an OFF state will increase from one to two or three, while the amount of the leak current will not become zero.

According to the embodiment, when the following condition is satisfied, the zener diodes 1 are in a stage of breakdown, and a reverse current flows in the circuit:

$$(E1-E2) > (nVz+VBE)$$

where, n represents the number of the zener diodes, Vz represents the breakdown voltage of the zener diodes and VB represents the voltage between the base and the emitter of the parasitic transistor.

Since the direction of the current which flows is forward for the inserted diode 12, the clamping function of the circuit including the n-stage series zener diodes 1 is not impeded.

Hereafter, other embodiments of the invention will be explained. The same symbols will be given to the same elements as what were mentioned above with regard to the drawings in connection with the embodiments and detailed explanation will be omitted.

Figure 3:
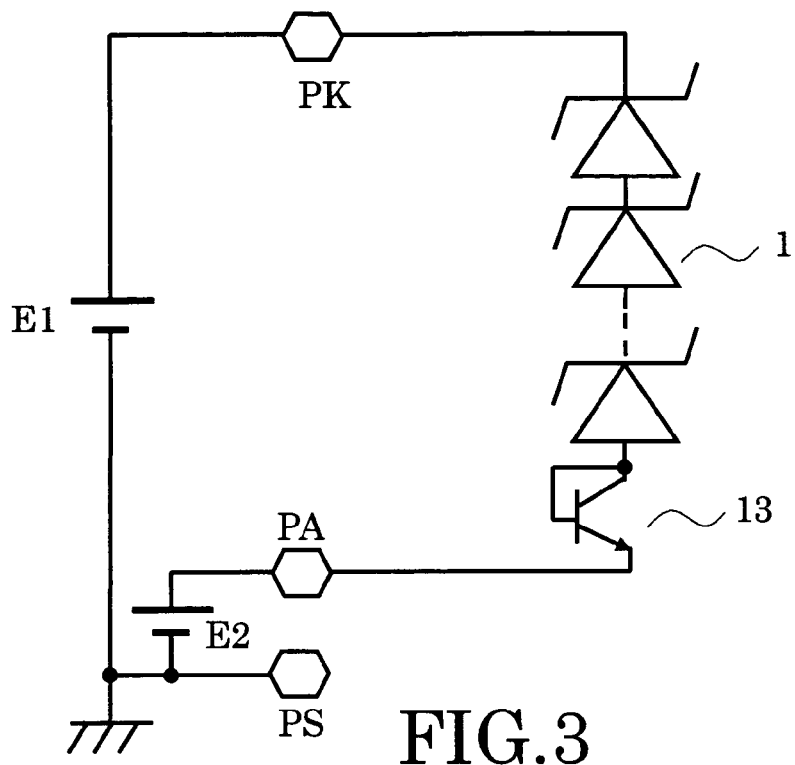
FIG. 3 is a schematic diagram showing the principal part of a circuit for optical semiconductors to be provided in an optical semiconductor device according to a second embodiment of the invention.

FIG. 3 is a schematic diagram showing the principal part of a circuit for optical semiconductors to be provided in an optical semiconductor device according to a second embodiment of the invention.

In the embodiment, CB (collector base)-short (the collector and the base are shorted) NPN transistor 13 is inserted in order to interrupt the leak current. By short-circuiting the collector and the base of the transistor, it has a function equivalent to a diode. Since the CB-short transistor 13 does not generate a leak current during operation and parasitic in-series resistance thereof is also low, a good characteristic can be obtained. Further, it is advantageous at a point that the NPN transistor can be easily formed on the same silicon substrate with a common process as the zener diodes 1.

Figure 4:
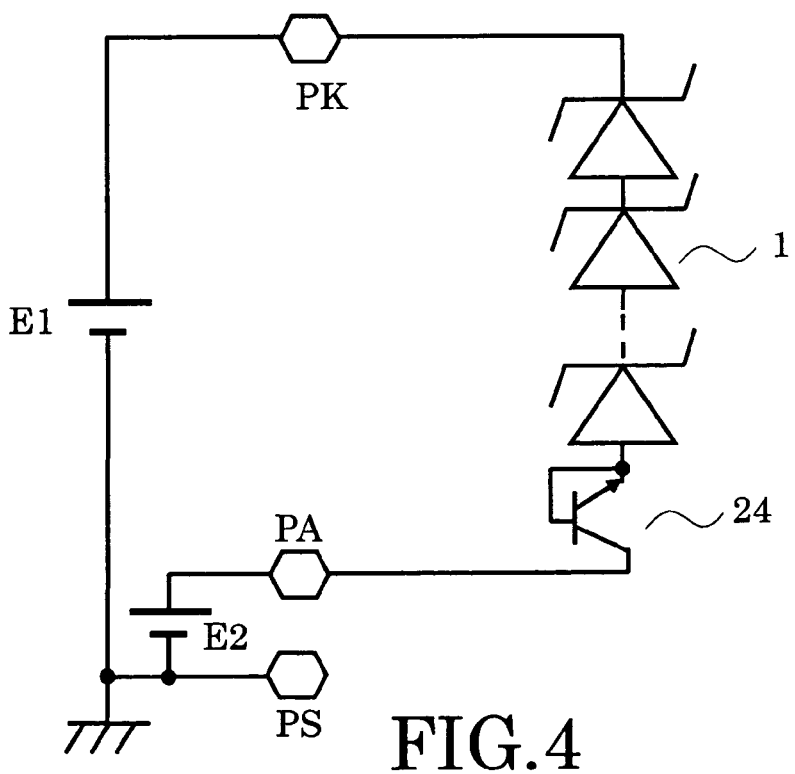
FIG. 4 is a schematic diagram showing the principal part of a circuit for optical semiconductors to be provided in a optical semiconductor device according to the third embodiment of the invention.

FIG. 4 is a schematic diagram showing the principal part of a circuit for optical semiconductors to be provided in a optical semiconductor device according to the third embodiment of the invention.

In the embodiment, the EB (emitter base)-short (the emitter and the base are short-circuited) vertical type NPN transistor 24 is inserted in order to interrupt a leak current. In the case of using the diode obtained by shoring out the emitter and the base of the transistor, it is advantageous at the point that high breakdown voltage is obtained. It is also advantageous at the point that the NPN transistor can be easily formed on the same silicon substrate with a common process as the zener diodes 1.

Although a very small leak current may occur in the transistor 24, it may not become a problem.

Figure 5A:
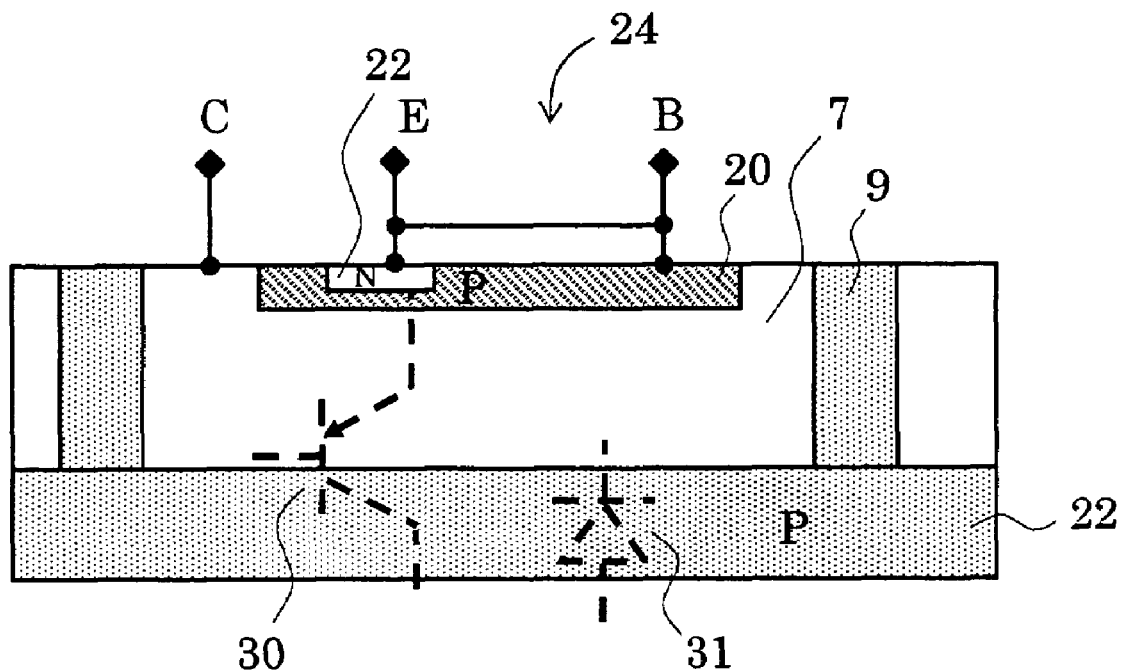
FIG. 5A is a schematic diagram showing a section of a vertical type NPN transistor of EB-short-circuited.
Figure 5B:
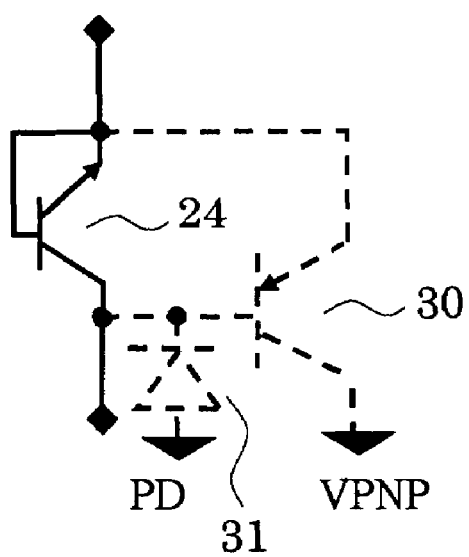
FIG. 5B is a schematic diagram showing the equivalent circuit of the transistor shown in FIG. 5A.

FIG. 5A is a schematic diagram showing a section of a vertical type NPN transistor of EB-short-circuited, and FIG. 5B is a schematic diagram showing the equivalent circuit thereof.

When forming the usual vertical type NPN transistor on the same p type silicon substrate 22 as the zener diodes 1 which is shown in FIG. 18A, a planer p type region 20 is formed in the surface of a n type island 7 which is electrically separated by p type separation layers 9, and a planer n type region 22 is further formed in the surface in the p type region 20. The n type region 22 act as the emitter E, the p type region act as the base B and the n type island 7 act as the collector C.

In this structure, a parasitic PNP transistor 30 is formed in a vertical direction. When the NPN transistor 24 operates as a diode, this parasitic transistor 30 will be in an ON state, and a small leak current will flow. However, since this leak current is generated at the time of the clamping operation of the zener diodes 1, it does not usually become a problem. On the other hand, a parasitic PD 31 accompanies the NPN transistor 24 of EB-short-circuited. However, the leak current Ip from this parasitic PD is not amplified by the parasitic transistor, but forms a leak current as it is. Since the amount of the photo leak current Ip of parasitic PD is about several microamperes, it will not become a problem if it is not amplified.

Figure 6:
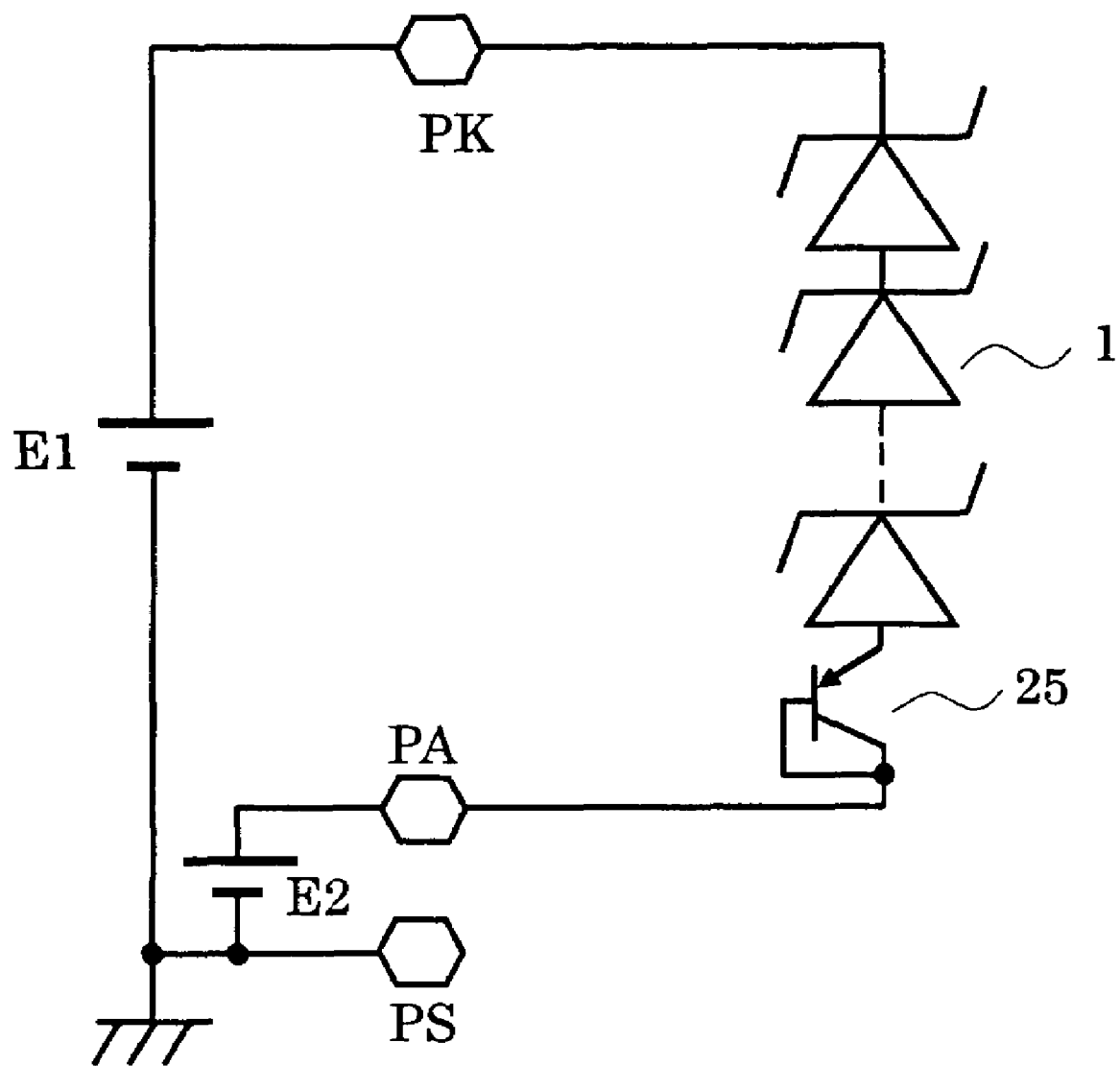
FIG. 6 is a schematic diagram showing a principal part of a circuit for optical semiconductors to be provided in an optical semiconductor device according to the fourth embodiment of the invention.

FIG. 6 is a schematic diagram showing a principal part of a circuit for optical semiconductors to be provided in an optical semiconductor device according to the fourth embodiment of the invention.

In the embodiment, CB (collector and base)-short lateral type PNP transistor 25 is inserted in order to interrupt the leak current of the zener diodes 1. That is, the collector and the base of the transistor 25 are short-circuited to form a diode. Generally, it is advantageous to use such a lateral type PNP transistor as a diode at the point that the obtained diode has a high breakdown voltage. Further, it is also advantageous at the point that the PNP transistor 25 can be easily formed on the same silicon substrate with a common process as the zener diodes 1.

Although a very small leak current arises in the transistor 25 by the parasitic junction, it does not become a problem in this embodiment.

Figure 7A:
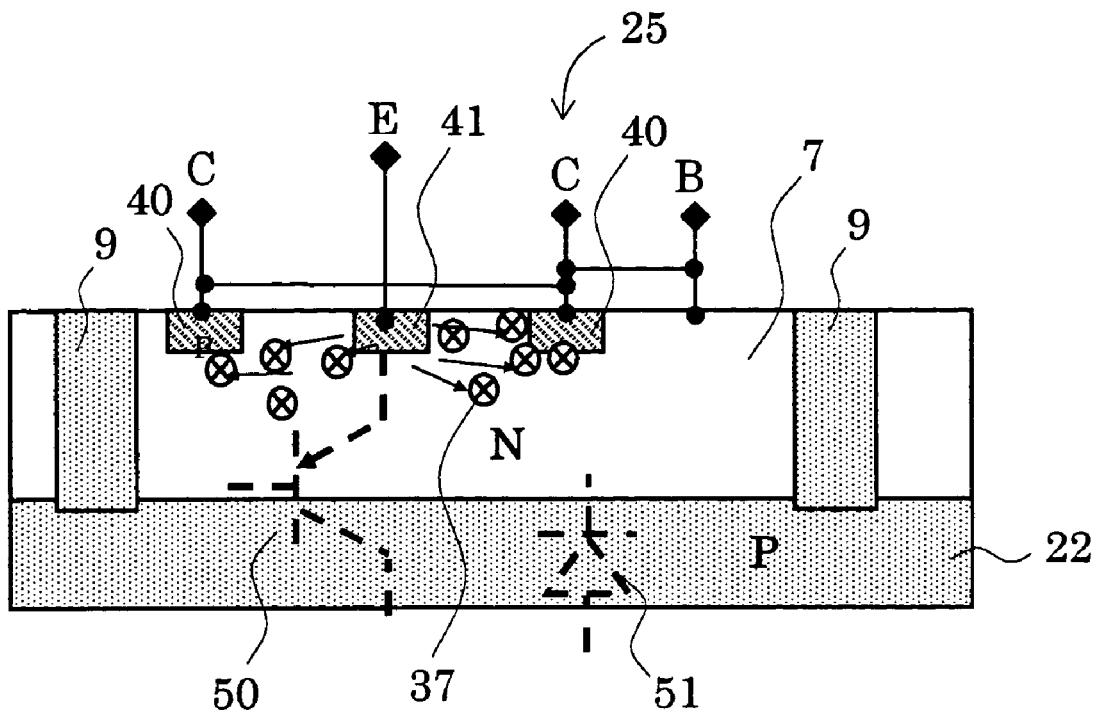
FIG. 7A is a schematic diagram showing the cross sectional structure of the lateral type PNP transistor 25.
Figure 7B:
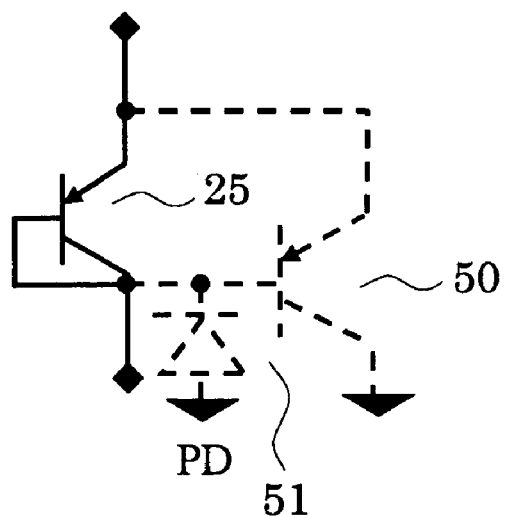
FIG. 7B is the equivalent circuit of the transistor shown in FIG. 7A.

FIG. 7A is a schematic diagram showing the cross sectional structure of the lateral type PNP transistor 25, and FIG. 7B is the equivalent circuit thereof.

When forming the usual lateral type PNP transistor 25 on the same p type silicon substrate 22 as the zener diodes 1 which were illustrated in FIG. 18A, a planar p type collector region 40 and a planar p type emitter region 41 are formed in the surface of the n type island 7 which is electrically separated by the separation layers 9. In this case, the n type island 7 acts as an n type base region.

Also in the case of the structure, the parasitic PNP transistor 50 is made in a lateral direction. When the transistor 25 is in a state of a diode action, the parasitic transistor 50 turns on and a leak current of very small quantity flows. However, as shown in FIG. 7A, this leak current 37 tends to be absorbed in the p type collector region 40. As a result, the amount of a leak current which flows into the silicon substrate 22 is smaller than the case of the third embodiment where the short-circuited NPN transistor 24 is used. Thus, it is advantageous at the point that the leak current by the parasitic junction is very small.

Figure 8:
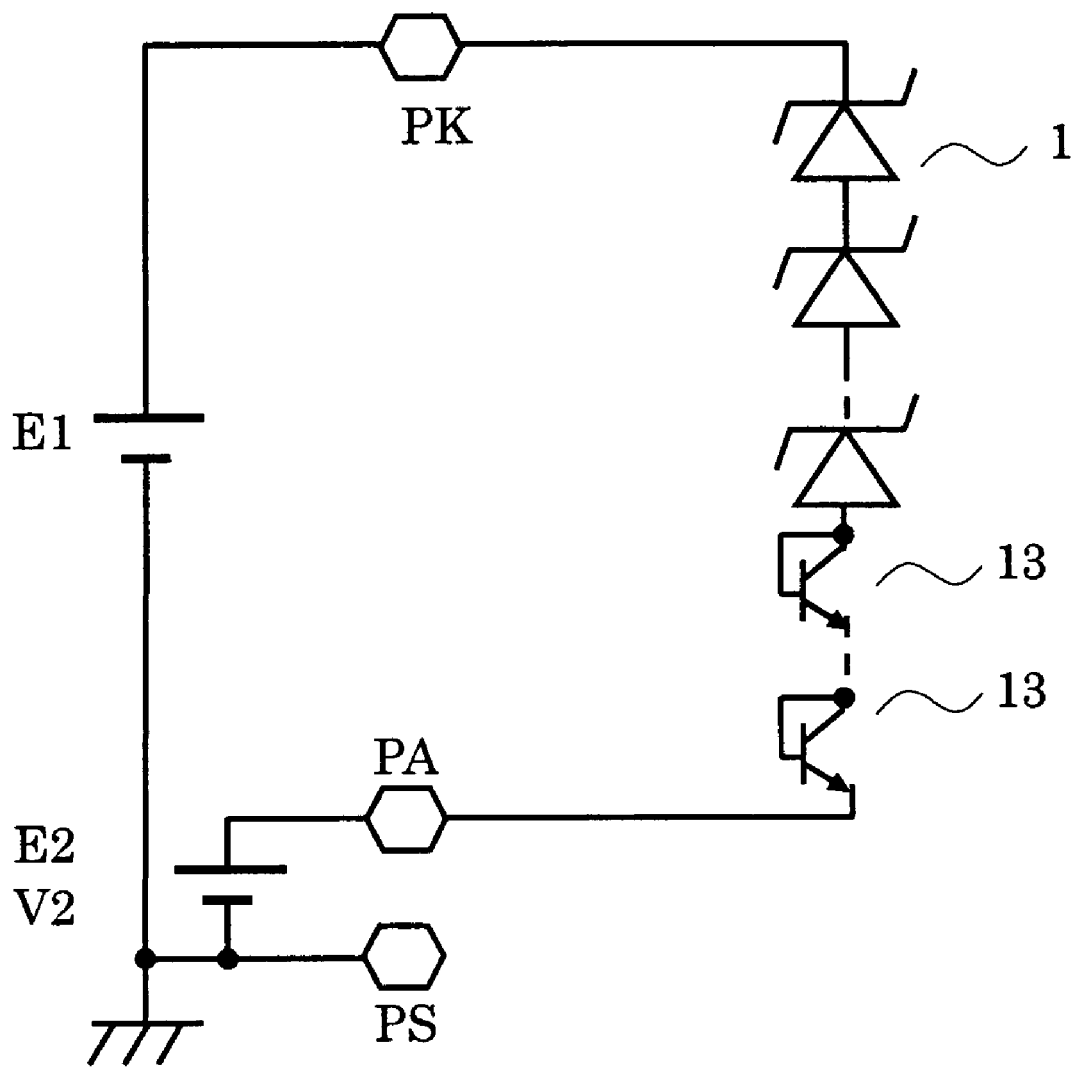
FIG. 8 is a schematic diagram showing a principal part of a circuit for optical semiconductors to be provided in a optical semiconductor device according to the fifth embodiment of the invention.

FIG. 8 is a schematic diagram showing a principal part of a circuit for optical semiconductors to be provided in a optical semiconductor device according to the fifth embodiment of the invention.

In the embodiment, the m NPN transistors 13 whose collector and base are short-circuited are inserted in series in order to interrupt the leak current in the zener diodes 1. By inserting two or more NPN transistors 13 in series, breakdown can be increased. The value of the number m of the transistors 13 can be determined so that the total breakdown thereof may exceed the voltage of the source E2. That is, the number m is set to be larger than the quotient of source voltage E2 divided by a breakdown voltage of each transistor 13.

In this case, the clamping potential at the time of clamping operation is shifted by (m×VBE) (where VBE is a voltage between the base and the emitter of the transistor 13), it is desirable to adjust the number n of the zener diodes according to the shift of the clamping potential.

In the above, the circuits for optical semiconductors used in the invention have been explained, referring to the first through the fifth embodiments of the invention. The optical semiconductor device of this invention can be obtained by combining any of these circuits for optical semiconductors with a light emitting element or a photo detecting device.

Figure 9A:
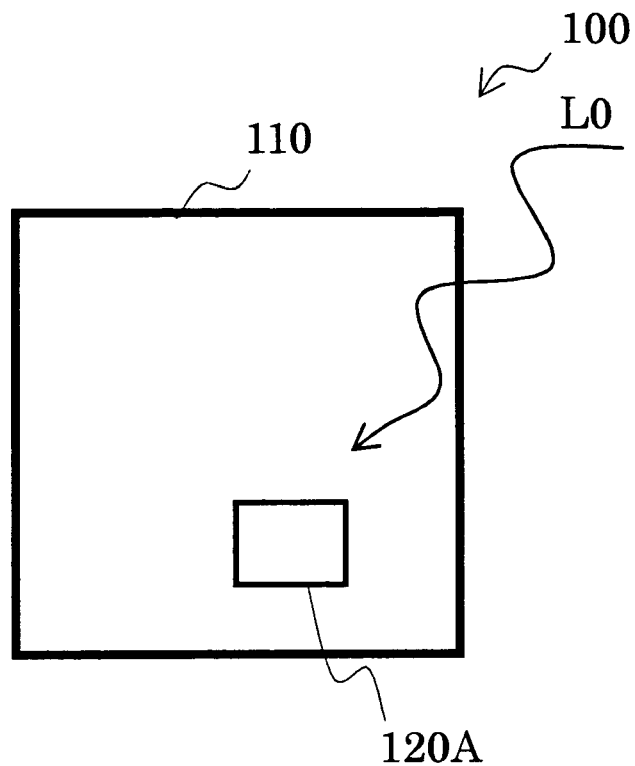
FIGS. 9A and 9B are schematic diagrams illustrating the principal parts of the optical semiconductor devices according to the embodiments of the invention.
Figure 9B:
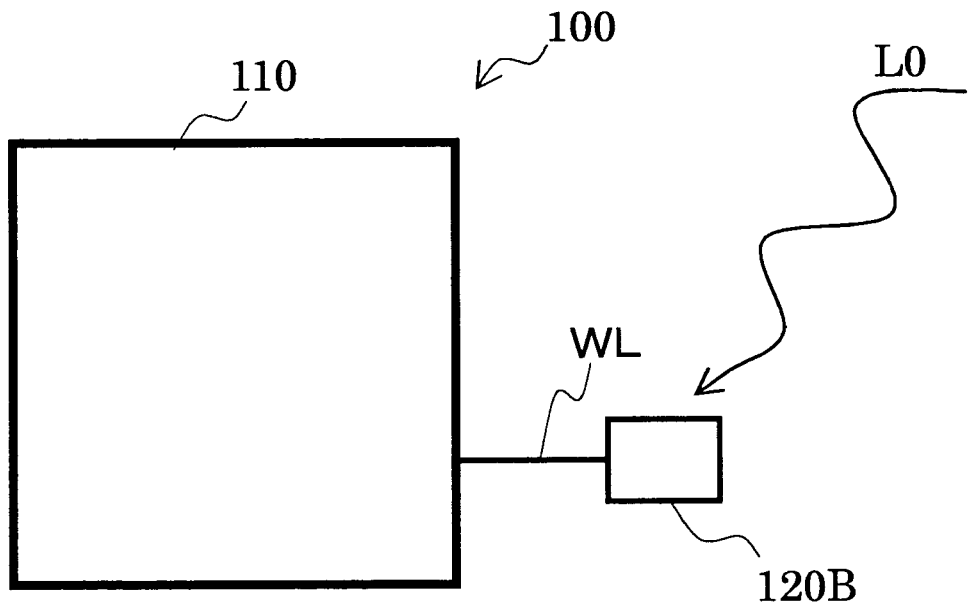

FIGS. 9A and 9B are schematic diagrams illustrating the principal parts of the optical semiconductor devices according to the embodiments of the invention.

First, the optical semiconductor device 100 illustrated in FIG. 9A has the circuit 110 for optical semiconductors including a photo detecting device 120A. That is, the circuit 110 for optical semiconductors and photo detecting device 120A are formed on the same semiconductor substrate monolithically. For example, as such a semiconductor device, a photo detecting IC where the photo diode 120A which has a p-n junction and the circuit 110 for optical semiconductors connected to this photo diode 120A are formed on a same silicon chip monolithically can be mentioned.

On the other hand, the optical semiconductor device 100 shown in FIG. 9B has a photo detecting device 120B, the circuit 110 for optical semiconductors provided separately, and the wiring WL that connects these parts. That is, in the case of this optical semiconductor device, the chip of photo detecting device 120B and the chip of the circuit 110 for optical semiconductors are formed separately, and are connected by wiring WL. However, even in this case, the circuit 110 for optical semiconductors and the photo detecting device 120B are accommodated in the same package.

A photodiode, a phototransistor, an optical electric conduction element and a solar cell can be used as the photo-detecting device 120A and 120B. Predetermined operation is performed by giving a light L0 to the optical semiconductor device 100 which contained such photo detecting device 120A (or 120B). An optical sensor and the receiver device for an optical link system can be mentioned as examples of such an optical semiconductor device.

The circuit 110 for optical semiconductors supplies a predetermined bias to the photo detecting device 120A (120B), or performs amplification and signal processing of a received signal. And the circuit 110 for optical semiconductors protects the photo detecting device 120A (120B) from ESD or acts as a voltage clamp by the series circuit of two or more rectifiers as mentioned above about the first through the seventh embodiments.

Figure 10A:
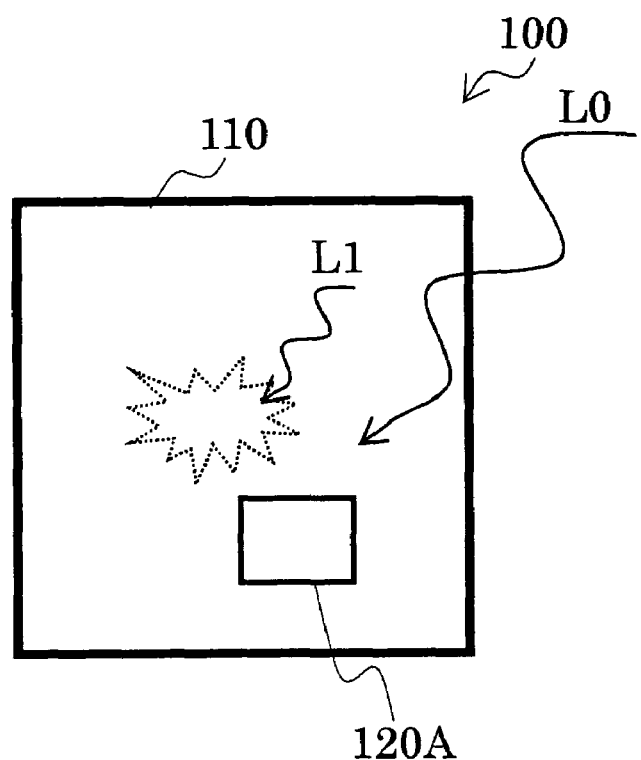
FIGS. 10A and 10B show that the light L1 which is a part of the light L0, incidents towards the photo detecting device irradiates the circuit 110.
Figure 10B:
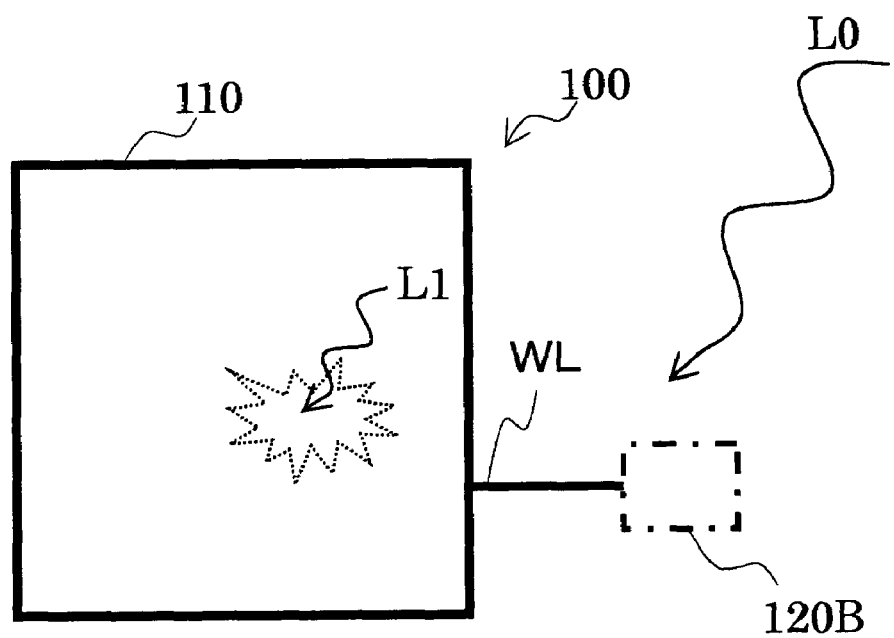

The circuit 110 for these light semiconductors is provided near the photo detecting device 120A (120B). Therefore, a light L1 which is a part of the light L0, which incidents towards the photo detecting device irradiates the circuit 110 in many cases as shown in FIG. 10A and FIG. 10B.

According to the invention, even if such a light L1 irradiates the circuit 110, increase of the leak current and/or malfunction of the circuit can be prevented as mentioned above about the first through the fifth embodiments. As a result, the optical semiconductor device which can control the increase in power consumption and can perform a stable operation can be realized.

Figure 11A:
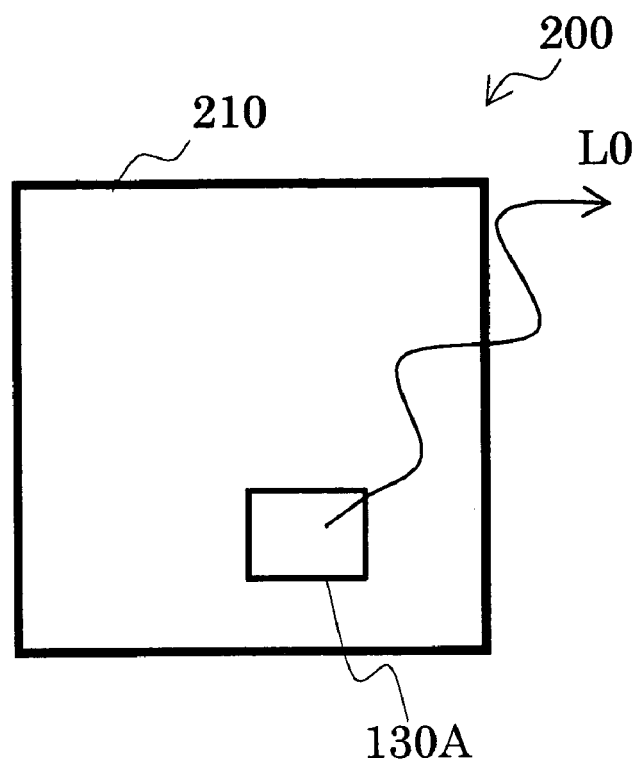
FIGS. 11A and 11B are schematic diagrams showing the optical semiconductor devices according to other embodiments of the invention.
Figure 11B:
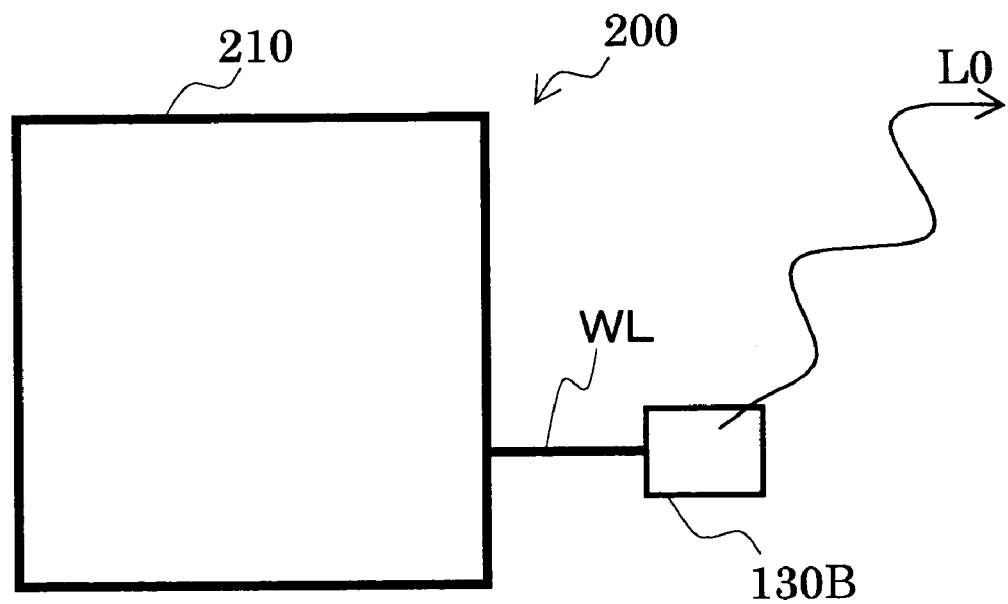

FIGS. 11A and 11B are schematic diagrams showing the optical semiconductor devices according to other embodiments of the invention.

The optical semiconductor device 200 shown in FIG. 11A has the circuit 210 for optical semiconductors including a light emitting element 130A. The circuit 210 for optical semiconductors and the light emitting element 130A are formed on a same semiconductor substrate monolithically. For example, a light emitting IC where the light emitting diode 130A which has a p-n junction and the circuit 210 connected to the diode 130A are formed on a single silicon chip monolithically can be mentioned.

On the other hand, the optical semiconductor device 200 shown in FIG. 11B has a photo detecting device 130B, a circuit 210 for optical semiconductors provided separately, and a wiring WL that connects these parts.

Various kinds of elements including a light emitting diode, a semiconductor laser, and EL (elctroluminescence) element can be used as the light emitting elements 130A and 130B. The circuit 210 for optical semiconductors supplies a current or a voltage for driving the light emitting element 130A (130B), adjusts luminescence intensity, or performs signal processing for sending a predetermined light signal in these light semiconductor device.

Figure 12A:
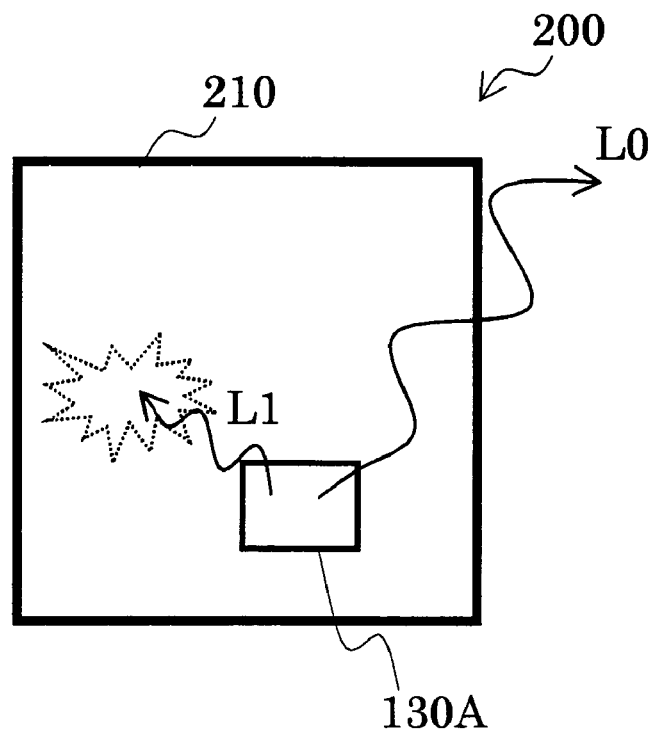
FIGS. 12A and 12B show that a part of light L1 emitted from the light emitting element 130A (130B) may also be irradiated onto the circuit 210 for optical semiconductors in many cases in the optical semiconductor device 200 including such a light emitting element.
Figure 12B:
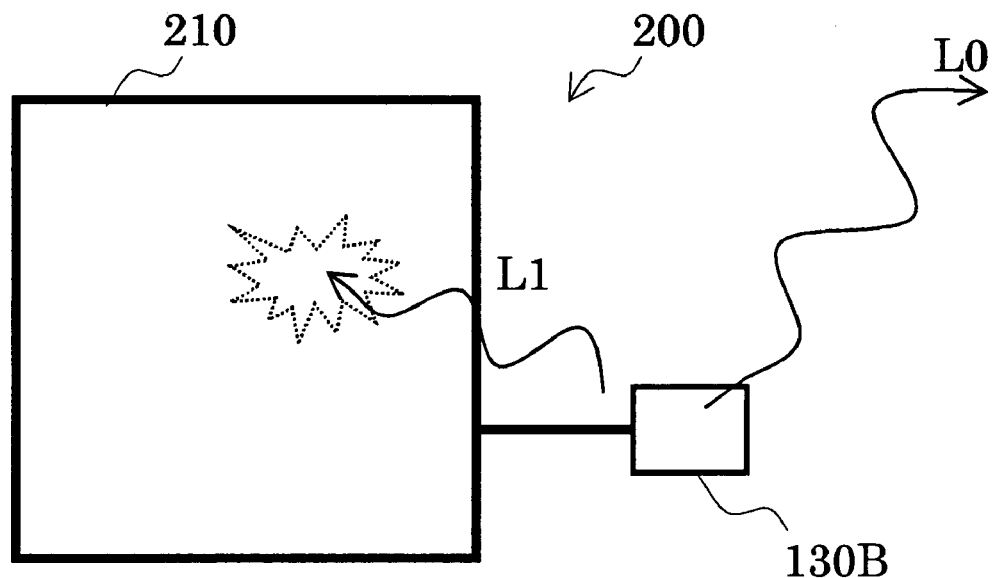

Apart of light L1 emitted from the light emitting element 130A (130B) may also be irradiated onto the circuit 210 for optical semiconductors in many cases in the optical semiconductor device 200 including such a light emitting element as shown in FIG. 12A and FIG. 12B.

According to the invention, even if such a light L1 irradiates, increase in leak current and/or malfunction can be prevented as mentioned above about the first through the fifth embodiments. As a result, the optical semiconductor device which can control the increase in power consumption and can perform a stable operation can be realized.

Figure 13:
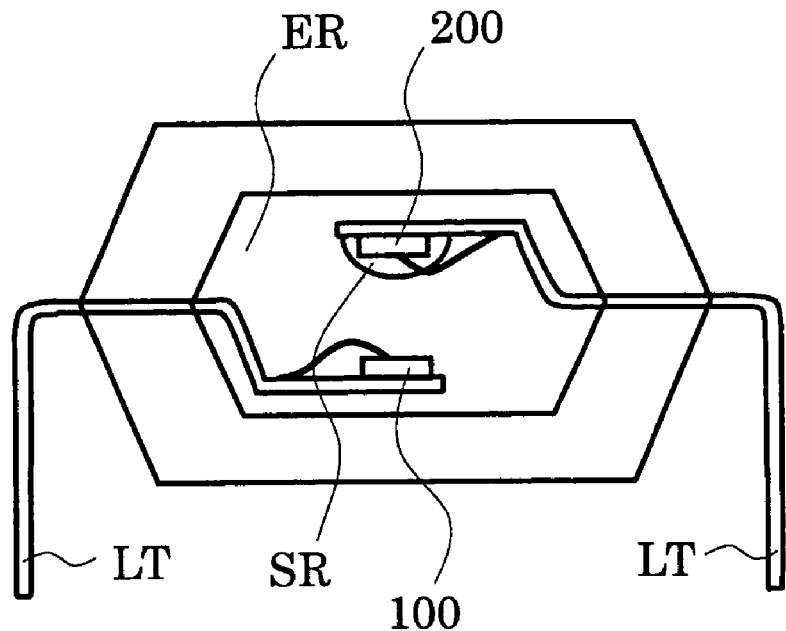
FIG. 13 is a sectional view showing the example of the optical semiconductor device according to an embodiment of the invention.

FIG. 13 is a sectional view showing the example of the optical semiconductor device according to an embodiment of the invention. That is, this figure shows a photo-coupler. A pair of lead terminals LT, LT which counter each other are provided in this example, and the light receiving part 100 and the light emitting part 200 are provided at the tips of the terminals LT respectively.

The light receiving part 100 and the light emitting part 200 include the circuits for optical semiconductors according to the embodiment of the invention, and a photo detecting element or a light emitting element, as shown in FIG. 9 through FIG. 12.

The circumference of the light emitting part 200 is molded by a silicone resin SR. Furthermore, the mold is also carried out over the circumference thereof including the light receiving part 100 by the epoxy resin ER.

Two electric circuits can be coupled by a light and signals can be transmitted by combining the light receiving part 100 and the light emitting part 200 in one package. Since signals are transmitted through a light, electric insulation becomes high and the advantage of being hard to be influenced of an electromagnetic wave noise is acquired.

And according to the invention, increase and malfunction of leak current accompanying irradiation of light can be prevented by providing circuits for optical semiconductors which are mentioned with regard to the first through the fifth embodiments at least in either these light receiving part 100 and the light emitting part 200. The photo-coupler which controls the increase in power consumption and stabilizes the operation can be realized.

Figures 14A, 14B:
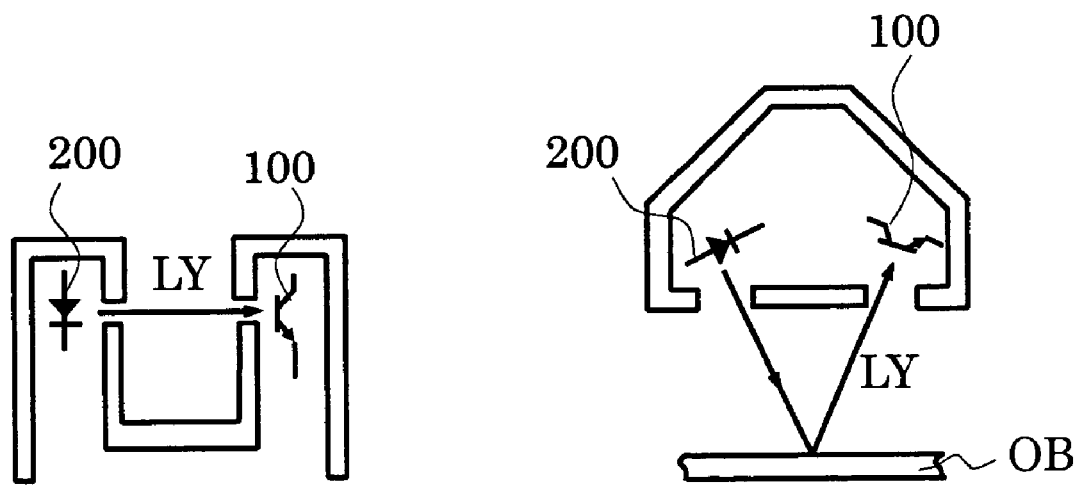
FIG. 14A shows a photo-interrupter of the so-called "transmission type" structure where the light receiving part 100 and the light emitting part 200 are opposing.
FIG. 14B shows a photo-interrupter of the so-called "reflection type" structure where the light receiving part 100 and the light emitting part 200 are not opposing but in the direction of slant.

FIGS. 14A and 14B show sectional views of the second example of the optical semiconductor device according to the embodiment of the invention. That is, these figures show photo-interrupters.

The example shown in FIG. 14A has the so-called "transmission type" structure where the light receiving part 100 and the light emitting part 200 are opposing. The light LY emitted from the light emitting part 200 is detected by the light receiving part 100. If the Light LY is interrupted with an object (not shown) intervening among these, it is detectable.

The example shown in FIG. 14B has the so-called "reflection type" structure where the light receiving part 100 and the light emitting part 200 are not opposing but in the direction of slant. If the object OB to be detected is provided in a set position, the light LY emitted from the light emitting part 200 will be reflected by the object OB, and the light will be detected by the light receiving part 100.

According to the invention, also in such a photo-interrupter, increase in leak current and/or malfunction accompanying irradiation of light can be prevented by providing circuits for optical semiconductors which are mentioned with regard to the first through the fifth embodiments at least in either the light receiving part 100 or the light emitting part 200.

Thus, photo-interrupters where the increase in power consumption is controlled and the operation is stabilized can be realized.

Figure 15A:
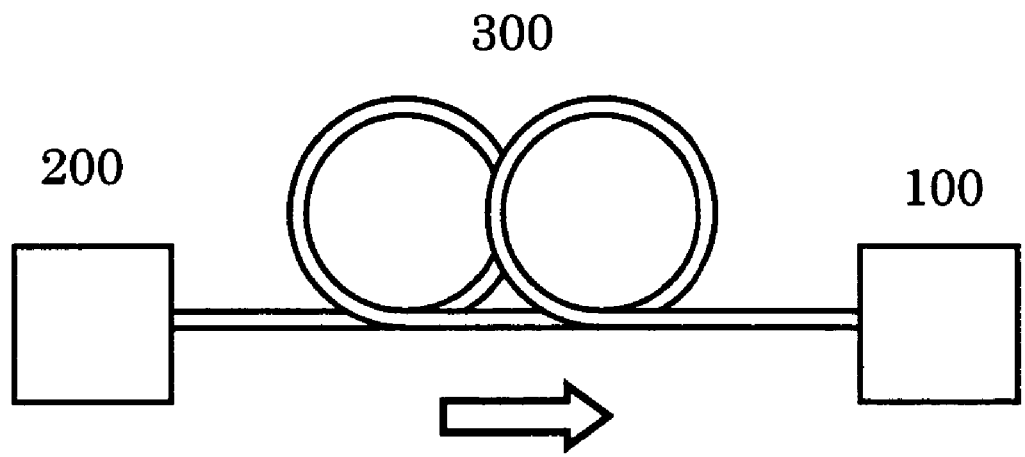
FIGS. 15A and 15B are schematic diagrams showing the third example of the optical semiconductor device according to the embodiment of the invention.
Figure 15B:
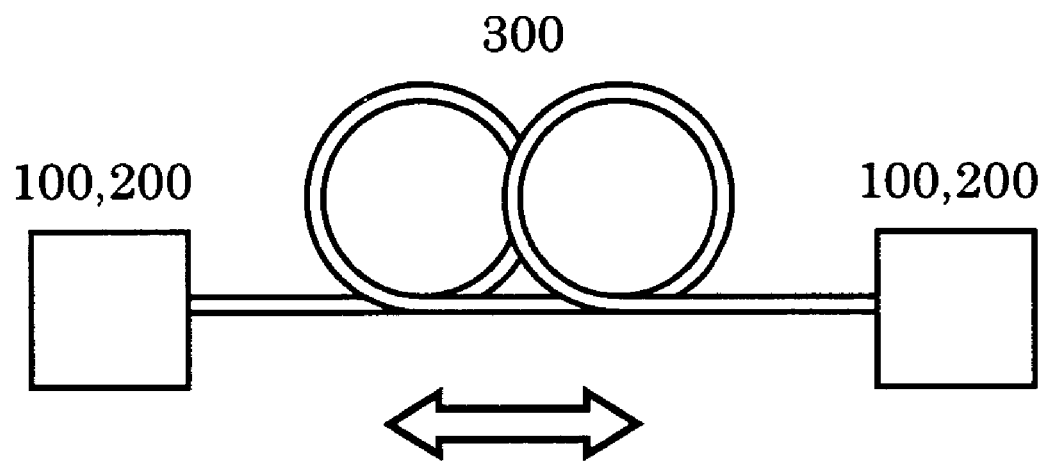

FIGS. 15A and 15B are schematic diagrams showing the third example of the optical semiconductor device according to the embodiment of the invention. These figures show optical link devices. The example shown in FIG. 15A is a "one-way type" device where the light emitting part 200 is provided in one end of the optical fiber 300, and the light receiving part 100 is provided in another end of the fiber 300, respectively. Light signals can be transmitted through the optical fiber 300 towards the light receiving part 100 from the light emitting part 200.

On the other hand, in the case of the example shown in FIG. 15B, the light receiving part 100 and the light emitting part 200 are provided in the both ends of the optical fiber 300, respectively. That is, in the case of this device, bidirectional optical transmission can be carried out.

The light receiving part 100 and the light emitting part 200 are provided with the circuit for optical semiconductors according to the embodiment of the invention, and a photo-detecting device or a light emitting element, as shown in FIGS. 9 through 12.

And according to the present invention, increase in leak current and/or malfunction accompanying irradiation of light can be prevented by providing a circuit for optical semiconductors which are mentioned with regard to the first through fifth embodiments at least in either light receiving part 100 and the light emitting part 200. Thus, the optical link device where the increase in power consumption is controlled and the operation is stabilized can be realized.

Heretofore, the embodiments of the present invention have been explained, referring to the examples. However, the present invention is not limited to these specific examples.

For example, although the circuits where two or more zener diodes 1 are connected in series are shown in FIG. 1 through FIG. 8, the present invention is not limited to these specific examples. That is, the invention can be applied to all the circuits which employ, instead of the zener diodes 1, any kind of elements which have rectification nature and the parasitic component that generates leak current with irradiation of light, and the same effect can be acquired as well.

Moreover, the semiconductor device according to the invention is not limited to the specific examples shown above. The invention can be applied to any kind of the semiconductor devices which have a circuit to operate under a circumstance where light is irradiated, and the same effect can be obtained as well.

About the structure of the circuit for optical semiconductors mentioned above and optical semiconductor device and the concrete composition of each element which constitutes the structure of them, that from which this contractor chooses from the known range suitably is also included in the present invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An optical semiconductor device comprising:
   an optical semiconductor element; and
   a circuit connected to the optical semiconductor element, having a series rectifying circuit including a plurality of zener diodes connected in series, and having a rectifying element whose anode is connected to an anode of the series rectifying circuit,
   wherein the zener diodes have parasitic components which generate a current upon irradiation of a light thereto.

2. The optical semiconductor device according to claim 1, wherein the circuit further includes a voltage supply which supplies a higher voltage to a cathode of the series rectifying circuit than to a cathode of the rectifying element.

3. The optical semiconductor device according to claim 1, wherein the rectifying element is a NPN transistor whose emitter and base are short-circuited.

4. The optical semiconductor device according to claim 1, wherein the rectifying element is a PNP transistor whose collector and base are short-circuited.

5. The optical semiconductor device according to claim 1, wherein the rectifying element is a NPN transistor whose collector and base are short-circuited.

6. The optical semiconductor device according to claim 1, wherein the optical semiconductor element is protected from a voltage exceeding a predetermined value by a breakdown of the zener diodes.

7. The optical semiconductor device according to claim 1, wherein a voltage applied to the optical semiconductor element is adjusted by a breakdown of the zener diodes when a voltage exceeding a predetermined value is applied.

8. The optical semiconductor device according to claim 1, wherein the optical semiconductor element and the circuit are monolithically provided on a same semiconductor substrate.

9. The optical semiconductor device according to claim 1, wherein the optical semiconductor element and the circuit are accommodated in a same package.

10. The optical semiconductor device according to claim 1, wherein the optical semiconductor element is a light emitting element.

11. The optical semiconductor device according to claim 1, wherein the optical semiconductor element is a light receiving element.

12. An optical semiconductor device comprising:
    an optical semiconductor element; and
    a circuit connected to the optical semiconductor element, having a series rectifying circuit including a plurality of first rectifying elements connected in series, and having a second rectifying element whose anode is connected to an anode of the series rectifying circuit,
    wherein the first rectifying elements have parasitic components which generate a current upon irradiation of light thereto.

13. The optical semiconductor device according to claim 12, wherein the circuit further includes a voltage supply which supplies a higher voltage to a cathode of the series rectifying circuit than to a cathode of the second rectifying element.

14. The optical semiconductor device according to claim 12, wherein the optical semiconductor element and the circuit are monolithically provided on a same semiconductor substrate.

15. The optical semiconductor device according to claim 12, wherein the optical semiconductor element and the circuit are accommodated in a same package.

16. The optical semiconductor device according to claim 12, wherein the optical semiconductor element is a light emitting element.

17. The optical semiconductor device according to claim 12, wherein the optical semiconductor element is a light receiving element.

18. The optical semiconductor device according to claim 12, wherein the series rectifying circuit limits a voltage to be supplied to the optical semiconductor element to a predetermined value.

* * * * *